(12) United States Patent
Matsunaga et al.

(10) Patent No.: US 8,309,385 B2
(45) Date of Patent: Nov. 13, 2012

(54) INERTIAL SENSOR, INERTIAL SENSOR DEVICE AND MANUFACTURING METHOD OF THE SAME

(75) Inventors: Masayuki Matsunaga, Kamiina-gun (JP); Kenji Sato, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 138 days.

(21) Appl. No.: 12/984,133

(22) Filed: Jan. 4, 2011

(65) Prior Publication Data

US 2011/0113879 A1    May 19, 2011

Related U.S. Application Data

(63) Continuation of application No. 11/878,883, filed on Jul. 27, 2007, now Pat. No. 7,886,596.

(30) Foreign Application Priority Data

Aug. 9, 2006 (JP) ................................. 2006-216505
Sep. 14, 2006 (JP) ................................. 2006-249404
Apr. 27, 2007 (JP) ................................. 2007-119281

(51) Int. Cl.
  *H01L 21/54* (2006.01)
  *H01L 23/047* (2006.01)
(52) U.S. Cl. .................... 438/51; 438/112; 257/E21.504
(58) Field of Classification Search ............ 438/51, 438/112, FOR. 367; 257/E21.504
See application file for complete search history.

(56) References Cited

U.S. PATENT DOCUMENTS

| | | | |
|---|---|---|---|
| 3,650,648 A * | 3/1972 | Lambrecht | 425/129.1 |
| 5,866,818 A * | 2/1999 | Sumi et al. | 73/514.33 |
| 6,112,594 A * | 9/2000 | Brinks et al. | 73/493 |
| 6,415,663 B1 | 7/2002 | Mochida et al. | |
| 7,000,472 B2 | 2/2006 | Kinoshita | |
| 7,096,733 B2 | 8/2006 | Ohta et al. | |
| 7,207,221 B2 | 4/2007 | Kawauchi et al. | |
| 7,223,703 B2 | 5/2007 | Sasaki | |
| 7,278,313 B2 | 10/2007 | Hayashi et al. | |
| 7,456,554 B2 | 11/2008 | Ishikawa et al. | |
| 7,497,117 B2 | 3/2009 | Ohta | |
| 7,754,130 B2 * | 7/2010 | Shirasaka et al. | 264/272.15 |
| 7,824,958 B2 * | 11/2010 | Minotti | 438/106 |
| 2006/0208344 A1 * | 9/2006 | Shiu et al. | 257/666 |
| 2006/0211176 A1 * | 9/2006 | Shirasaka et al. | 438/123 |

(Continued)

FOREIGN PATENT DOCUMENTS

CN        1580701 A        2/2005

(Continued)

*Primary Examiner* — George Fourson, III

(74) *Attorney, Agent, or Firm* — Oliff & Berridge, PLC

(57) ABSTRACT

An inertial sensor, comprises a detection element detecting an amount of a physical quantity in a detection axis direction, a plurality of support members having flexibility and supporting nearly a center of the detection element, and a package substrate housing the detection element and the plurality of support members. In a case when an X-axis is defined as an extending direction of the plurality of support members, a Y-axis is perpendicular to the X-axis in a plane including the detection element, and a Z-axis is perpendicular to the X-axis and the Y-axis, one of load components in a direction of the Y-axis of the detection member applied to the plurality of support members is nearly equal to other among the plurality of support members, and one of load components in a direction of the Z-axis is nearly equal to the other among the plurality of support members.

10 Claims, 13 Drawing Sheets

U.S. PATENT DOCUMENTS

| | | | |
|---|---|---|---|
| 2007/0028685 A1* | 2/2007 | Shirasaka et al. | 73/493 |
| 2007/0099349 A1* | 5/2007 | Adachi et al. | 438/123 |
| 2007/0111393 A1* | 5/2007 | Burghout et al. | 438/123 |

FOREIGN PATENT DOCUMENTS

| | | |
|---|---|---|
| JP | A-09-166445 | 6/1997 |
| JP | A-11-325915 | 11/1999 |
| JP | A-2000-337884 | 12/2000 |
| JP | B2-3259645 | 12/2001 |
| JP | A-2002-22452 | 1/2002 |
| JP | A-2003-185439 | 7/2003 |
| JP | A-2003-227844 | 8/2003 |
| JP | A-2004-354169 | 12/2004 |
| JP | A-2004-361175 | 12/2004 |
| JP | A-2005-203434 | 7/2005 |
| JP | A-2005-249428 | 9/2005 |
| JP | A-2006-064539 | 3/2006 |
| JP | A-2006-105963 | 4/2006 |
| WO | WO 03/100350 A1 | 12/2003 |

* cited by examiner

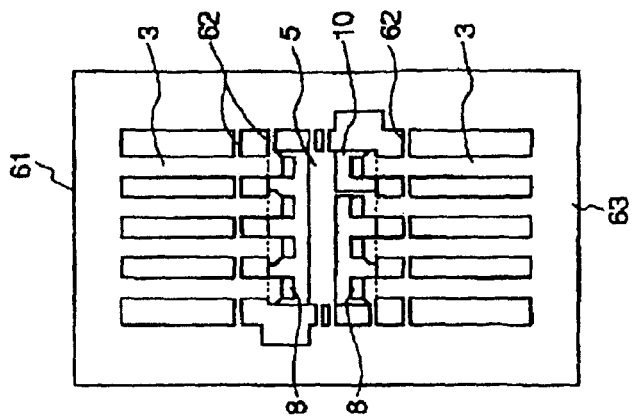
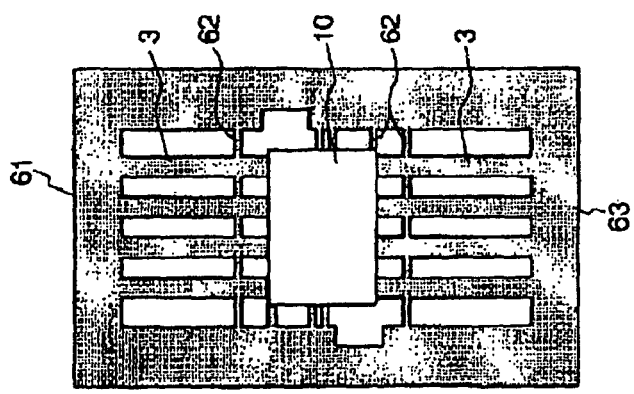
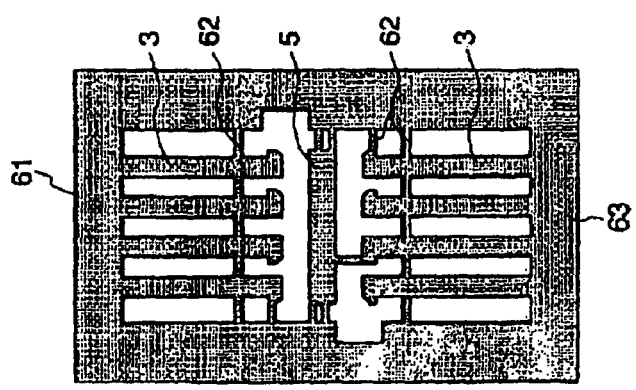
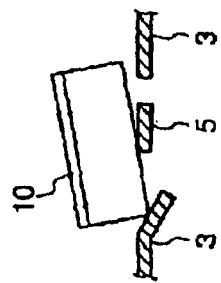
FIG. 3A
FIG. 3B
FIG. 3C
FIG. 3D

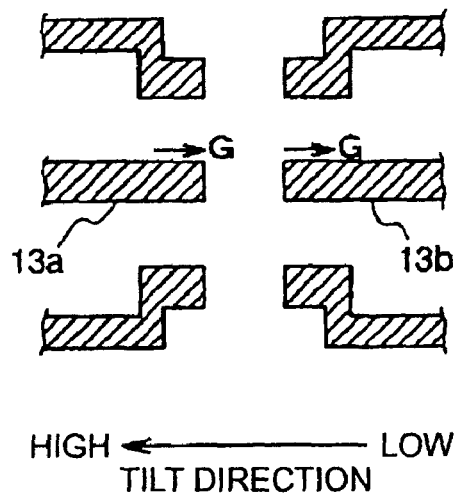
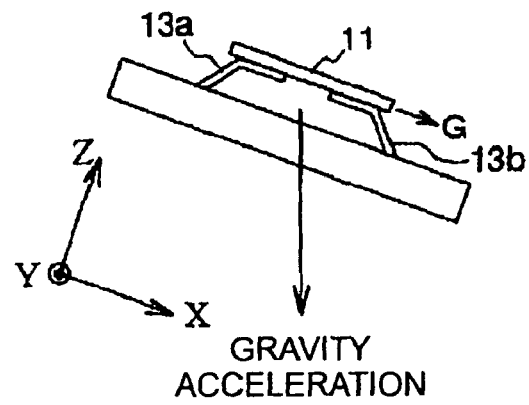
FIG.11A
FIG.11B
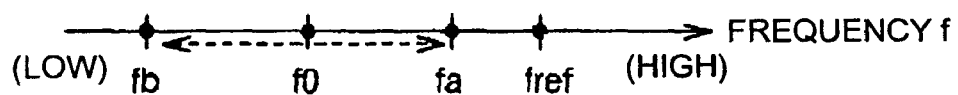
FIG.11C

HIGH ←——— LOW
TILT DIRECTION

INERTIAL SENSOR, INERTIAL SENSOR DEVICE AND MANUFACTURING METHOD OF THE SAME

This is a Continuation of application Ser. No. 11/878,883 filed Jul. 27, 2007, now U.S. Pat. No. 7,886,596 which claims the benefit of Japanese Patent Application No. 2006-216505 filed Aug. 9, 2006; Japanese Patent Application No. 2006-249404 filed Sep. 14, 2006; and Japanese Patent Application No. 2007-119281 filed Apr. 27, 2007. The disclosures o the prior applications are hereby incorporated by reference herein in their entirety.

BACKGROUND

1. Technical Field

The present invention relates to an inertial sensor such as an acceleration sensor and a gyro sensor and a method for manufacturing it, and is particularly preferred for in-vehicle navigation devices.

2. Related Art

In-car navigation devices are popularly spread out. When detecting a current position of a vehicle via such device, two methods are combined: a method for positioning a vehicle by using a so-called global positioning system (GPS), and a method for autonomously positioning the moving direction and distance of a vehicle. In order to autonomously position the moving direction and distance of a vehicle, an inertial sensor such as a gyro sensor (an angular velocity sensor) for detecting acceleration or angular velocity yielded by a moving vehicle are mounted in car navigation devices.

When acceleration or angular velocity is detected by using an inertial sensor, the detection axis of the sensor needs to be coincided with a direction to be detected. For example, the detection axis of a gyro sensor needs to be installed upward along the vertical direction.

In recent years, downsizing in-car navigation devices have been advanced. A casing main body (hereinafter, referred to as "an navigation body"), has been developed as to be installed into a center console between a driver seat and a passenger seat, though it was conventionally installed under a seat or inside a trunk.

FIGS. 15A and 15B show a navigation body installed in a center console. FIG. 15A is the whole perspective view. FIG. 15B shows a gyro sensor mounted in the navigation body.

When a navigation body 100 is installed in a center console 102 as shown in FIG. 15A, the surface of a display 101 and an operation panel (not shown) are preferably directed to a driver's viewing direction because of his/her visibility of the display 101 and operability of the operation panel. That is, the navigation body 100 is preferably installed tilted obliquely upward from the horizontal direction in the center console 102. When the navigation body 100 is installed tilted obliquely upward in the center console 102, however, as shown in FIG. 15B, the detection axis G of a gyro sensor 104 is slanted by angle (a tilt angle) θ from the vertical direction V. Here, the gyro sensor 104 is mounted on a printed board 103 in the navigation body 100 that is installed with also tilted by the angle θ. Due to this tilt, errors occur in angular velocity detected by the gyro sensor 104.

In ordinal car navigation devices, such detection errors of the gyro sensor 104 due to the installation angle of the navigation body 100 are corrected by software arithmetic processing. The software arithmetic processing, however, is insufficient. For example, the software arithmetic processing cannot correct detection errors when the tilt angle θ of the navigation body 100 is 30° or more.

In order to avoid such insufficiency, an inertial sensor is required that can correctly perform a detection even when a car navigation device is installed tilted. Various kinds of sensors are proposed to satisfy the requirement.

For example, a first example of related art discloses an angular velocity sensor in which a detection axis is tilted by an angular velocity detection element inside the sensor being slanted from a holder without changing the shape of or mounting method of the sensor.

Further, a second example of related art discloses a sensor device provided with a detection element detecting a direction and magnitude of a physical quantity having a constant directional property and a fixture for fixing and supporting the detection element. In the device, the detection element is fixed to the fixture and tilted by a predetermined reduced angle in a reducing direction. The reducing direction reduces an predicted angular difference between the direction of the detection axis, serving as the reference for detecting the magnitude and the direction of the physical quantity, and a direction of the physical quantity actually applied to the detection element during detecting.

A third example of related art discloses a supporting structure in which the angle of a vibrator in a package is set by a support connecting the vibrator to a support substrate and an adhesive bonding the support substrate and a package substrate so as to direct the detection axis of the vibrator in a desired direction.

Here, WO03/100350 is the first example, JP-A-2003-227844 is the second example, and JP-A-2005-249428 is the third example of related art.

The sensors disclosed in the first and second examples, however, may deteriorate detection performance due to acoustic leakages or unwanted vibration modes of the quartz crystal resonator yielded from a fixture since the quartz crystal resonator serving as a detection element is directly fixed to the fixture.

In addition, the sensors disclosed in the first and second examples, a specialized tool is required for every fixing angle since the detection element in itself needs to be fixed tilted. As a result, production costs soar. The reason for requiring the specialized tool is as follows. In each sensor, the detection element is irradiated with a laser to adjust the sensor after fixing the detection element to the fixture. Thus, one of focal points of the laser differs from others every one of fixing angles when changing the fixing angle, resulting in that the same tool is not shared.

Further, in the second example, a slit is formed in a detection element in itself for fixing it tilted. This process causes a high cost of a detection element, increasing total production costs.

Furthermore, in the first and second examples the angle of a detection axis cannot be set to any angle when a sensor is mounted on a mount board since a detection element is set tilted within a sensor.

Further, a support (bonding wire) connecting a vibrating element (vibrator) to a support substrate shown in the third example significantly affects occurrence of acoustic leakages and unwanted vibration modes from the vibrating element, sometimes deteriorating detection performance of the sensor. In addition, changing the angle with using the adhesive causes large variations in production, resulting in a setting angle being inaccurate.

Further directly fixing an element to a fixture in the first and second examples also causes occurrence of acoustic leakages and unwanted vibration modes from the vibrating element, resulting in a setting angle being inaccurate.

Taking the above into consideration, the inventors pay attention to a method that a sensor device in which a sensor element is fixed by a conventional bonding method is bonded to a lead frame and molded. The method can suppress the occurrence of acoustic leakages and unwanted vibration modes since the sensor element is fixed by the conventional bonding method, control a setting angle corresponding to a detection axis, by which the sensor responds to movements, with the shape of the lead frame, and further secure mechanical strength as molded.

However, in the method, the sensor device including the sensor is tilted with respect to a mount surface corresponding to the detection axis by which the sensor responds to movements, by controlling the shape of the lead frame. Thus, when a sensor device is formed by using a related art molding method in which the outline of the molded one follows the outline of the sensor device, the outline of the sensor device is not parallel with the mount surface. This outline may worsen workability in mounting processes.

SUMMARY

An advantage of the invention is to provide an inertial sensor that can set a detection axis at a predetermined angle without deteriorating detection performance of a detection element.

Another advantage of the invention is to provide a method for manufacturing an inertial sensor device that can accurately set the detection axis of the sensor when the device is fixed on a mount surface having a predetermined tilt angle, and can set a predetermined angle that the detection axis of the sensor makes with respect to a bottom surface and an upper surface of a molded package, improving workability.

An inertial sensor according to a first aspect of the invention includes a detection element detecting an amount of a physical quantity in a detection axis direction, a plurality of support members having flexibility and supporting nearly a center of the detection element, and a package substrate housing the detection element and the plurality of support members. In a case when an X-axis is defined as an extending direction of the plurality of support members, a Y-axis is perpendicular to the X-axis in a plane including the detection element, and a Z-axis is perpendicular to the X-axis and the Y-axis, one of load components in a direction of the Y-axis of the detection member applied to the plurality of support members is nearly equal to other among the plurality of support members, and one of load components in a direction of the Z-axis is nearly equal to the other among the plurality of support members.

This structure can render the setting condition of mechanical resonance frequency of each support member robust to the change of force caused by acceleration since an effect due to the acceleration is equally applied to each support member. That is, the following trouble can be prevented. The resonance frequency of the support member varies to an unexpected value. In addition, the resulting frequency approaches near the driven vibration of the inertial sensor during a process in which the driven frequency of the inertial sensor varies with a temperature change. The driven vibration frequency of the inertial sensor is coupled with (attracted to) the resonance frequency of the support member. As a result, the output signal of the inertial sensor jumps.

In this case, the detection element may have a detection axis that detects an angular velocity and coincides with the direction of the Z-axis that makes an angle of θ with respect to a vertical direction, and a resulting load combined by the component in the direction of the Y-axis of the load and the component in the direction of the Z-axis of the load may be at least a load component based on gravity acceleration.

This structure can render the setting condition of mechanical resonance frequency of each support member robust to the change of force caused by acceleration since an effect due to the acceleration is equally applied to each support member even when the inertial sensor is set tilted. That is, the following trouble can be prevented. The resonance frequency of the support member varies to an unexpected value. In addition, the resulting frequency approaches near the driven vibration of the inertial sensor during a process in which the driven frequency of the inertial sensor varies with a temperature change. The driven vibration frequency of the inertial sensor is coupled with (attracted to) the resonance frequency of the support member. As a result, the output signal of the inertial sensor jumps.

In addition, the driven frequency of the inertial sensor can be inspected while the inertial sensor is tilted. As a result, the inspection process can be simplified.

Further, this structure has an advantage in that the resonance frequency of the support member is robust to acceleration of a vehicle during its movement.

In this case, the Z-axis may make the angle of θ with respect to the vertical direction by tilting the inertial sensor around a longitudinal direction of the sensor.

This structure can reduce the height of an inertial sensor device when the inertial sensor is built into an inertial sensor device as the sensor is tilted.

An inertial sensor device according to a second aspect of the invention includes the inertial sensor of the first aspect of the invention, a plurality of lead terminals electrically coupled to the inertial sensor, and a molded package including the inertial sensor.

This structure can render the setting condition of mechanical resonance frequency of each support member robust to the change of force caused by acceleration since an effect due to the acceleration is equally applied to each support member. That is, the following trouble can be prevented. The resonance frequency of the support member varies to an unexpected value. In addition, the resulting frequency approaches near the driven vibration of the inertial sensor during a process in which the driven frequency of the inertial sensor varies with a temperature change. The driven vibration frequency of the inertial sensor is coupled with (attracted to) the resonance frequency of the support member. As a result, the output signal of the inertial sensor jumps.

In this case, the molded package may include a first lead terminal extending toward a direction of a bottom surface of the molded package from a first part of the molded package, and a second lead terminal longer than the first lead terminal, the second lead terminal extending toward the direction of the bottom surface of the molded package from a second part facing the first part. The second lead terminal may include a plurality of bending parts facing the molded package.

This structure can prevent the inertial sensor from being floated by a coated solder along the second lead terminal when the inertial sensor is mounted to a mount board.

A method for manufacturing an inertial sensor device according to a third aspect of the invention is the method that molds a lead frame and a sensor device with resin. The lead frame includes a plurality of lead terminals electrically connecting a mount board. The sensor device includes a sensor that responds to a movement with respect to a detection axis and is directed by a shape of the lead frame at a setting angle. The method includes: bonding the sensor device to the lead frame; overlapping a lower die having a first surface in which a concave part is formed and an upper die having a second surface in which a second concave part is formed so that the first surface and the second surface meet each other with the lead frame interposed between the lower die and the upper die to house the sensor device in a cavity formed by the first concave part and the second concave part, after the bonding; and injecting resin into the cavity. The first concave part has a first bottom surface and the second concave part has a second bottom part, and after the overlapping, the first bottom surface and the second bottom surface are tilted with respect to a main surface of the lead frame and are in parallel with each other.

This method can form a molded package that has an outline in parallel with the mount board and includes the sensor device adjusted to the setting angle with respect to the mount board corresponding to the detection axis responding to the movement. As a result, the inertial sensor device can be manufactured that has improved workability in mounting the device.

In the method, the first bottom surface and the second bottom surface may be tilted by the setting angle with respect to the main surface of the lead frame.

Using the dies can form the molded package of the inertial sensor device so that the bottom surface of the sensor device makes an angle with respect to the bottom surface of the inertial sensor device and the normal line of the bottom surface of the inertial sensor device makes a predetermined angle with respect to the detection axis.

As a result, the inertial sensor device can be manufactured that allows the detection axis of the sensor to be accurately set even if the inertial sensor device is fixed to a tilted surface by setting an angle that the normal line of the bottom surface of the inertial sensor device makes with respect to the detection axis equal to an angle that the normal line of the surface of the tilted mount board on which the inertial sensor device is mounted makes with respect to the vertical direction.

BRIEF DESCRIPTION OF THE DRAWINGS

The invention will be described with reference to the accompanying drawings, wherein like numbers reference like elements.

FIG. 1A is the top view.

FIG. 1B is the side view.

FIGS. 3A to 3D are schematic views illustrating a lead terminal unit used in the gyro sensor device of the first embodiment.

FIG. 11A is a plan view illustrating wires 13 and a tilt direction where the present invention is not applied.

FIG. 11B is a side view illustrating a gyro sensor device, in which the quartz crystal resonator element 11 is placed on the wires 13 shown in FIG. 11A, installed tilted.

FIG. 11C shows the relationship between the resonance frequency of the wire 13 of the gyro sensor device shown in FIG. 11B and the resonance frequency of the quartz crystal resonator element 11.

FIG. 15A is the whole perspective view.

FIG. 15B shows a gyro sensor mounted in the navigation body.

DESCRIPTION OF EXEMPLARY EMBODIMENTS

Embodiments of the present invention will now be described below.

In the embodiments, a gyro sensor will be described as an example of an inertial sensor of the invention.

Figure 1B:
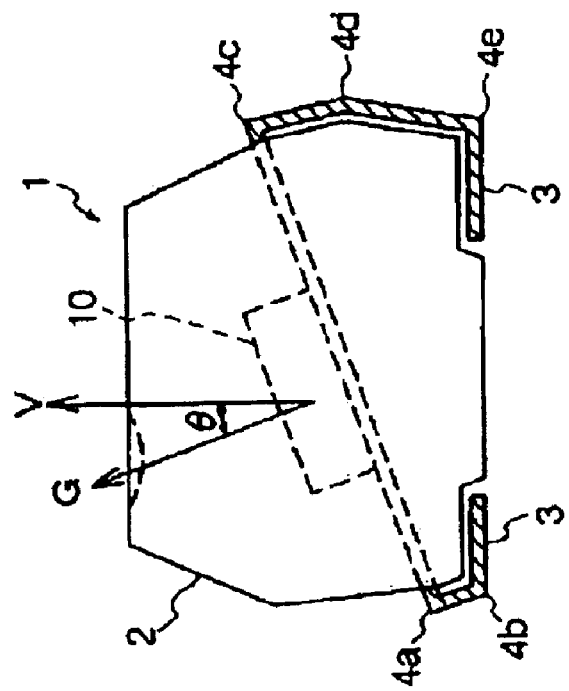
FIGS. 1A and 1B are schematic views illustrating the structure of a gyro sensor device according to a first embodiment of the invention.
Figure 1A:
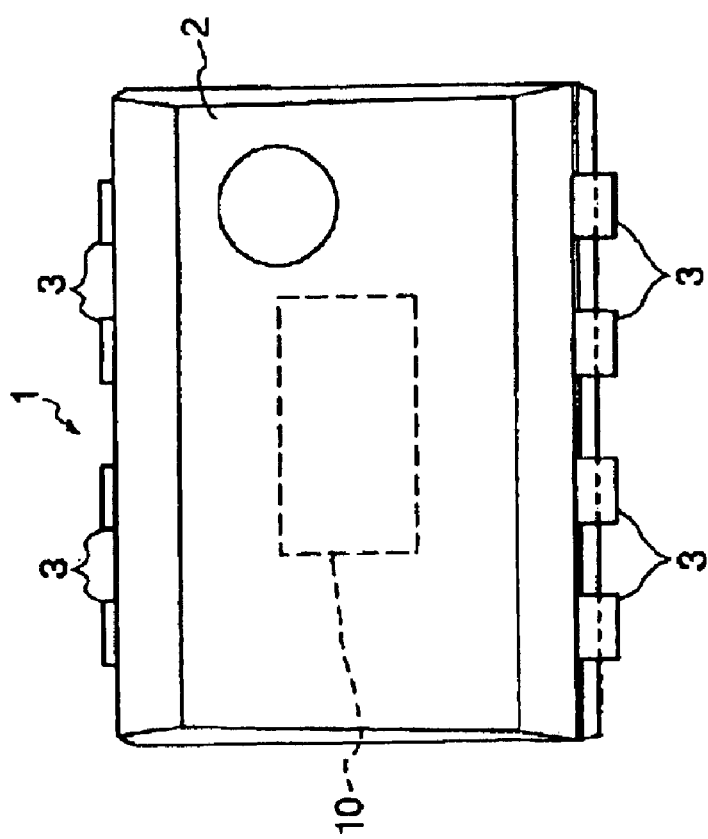

FIGS. 1A and 1B are schematic views illustrating the structure of a gyro sensor device of a first embodiment of the invention. FIG. 1A is the top view. FIG. 1B is the side view.

In a gyro sensor device 1 shown in FIGS. 1A and 1B, a gyro sensor 10 is sealed with a resin part 2, formed by a molding compound such as resin, so that the angular velocity detection axis G (detection axis G) of the gyro sensor 10 is tilted by an angle θ with respect to the perpendicular line V of the upper surface of the gyro sensor device 1. From both the long sides of the resin part 2, a plurality of lead terminals extends outside.

Here, the upper surface and a mounting side surface (the other surface opposite to the upper surface) of the gyro sensor device 1 are in parallel with each other. The lead terminals 3 are electrically connected to the gyro sensor 10 inside the resin part 2. The lead terminals 3 exposed from the resin part 2 at a position close to its bottom surface are bent inside at bending parts 4a and 4b to form electrode terminals on the bottom surface of the resin part 2. In contrast, other lead terminals 3 exposed from the resin part 2 at a position far from its bottom surface also bent to form electrode terminals on the bottom surface of the resin part 2. In this case, they are bent inside at bending parts 4c, 4d, and 4e since the length of a lead part of each lead terminal 3 exposed from the resin part 2 is long.

Figure 2A:
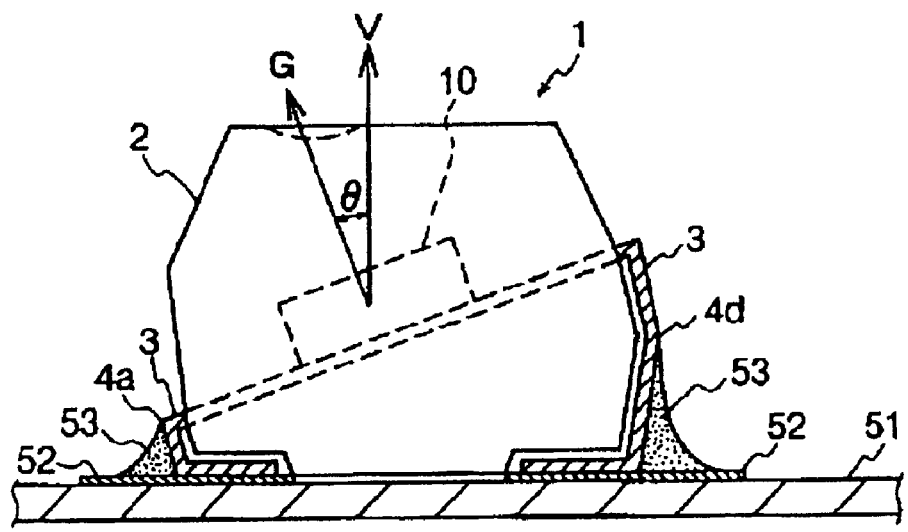
FIG. 2A shows a mounting example of the gyro sensor device of the first embodiment.

FIG. 2A shows a mounting example of the above gyro sensor device of the first embodiment. As shown in FIG. 2A, by connecting each lead terminal 3 of the gyro sensor device 1 of the embodiment to a pattern electrode 52 with a solder 53, the gyro sensor device 1 can be mounted so that its detection axis G is tilted by the angle θ with respect to the perpendicular line (the vertical direction) of the mount surface of a mount board 51.

The reason why the lead terminal 3 exposed from the position far from the bottom surface of the gyro sensor device 1 is provided with the bending parts 4c, 4d, and 4e is as follows.

Figure 2B:
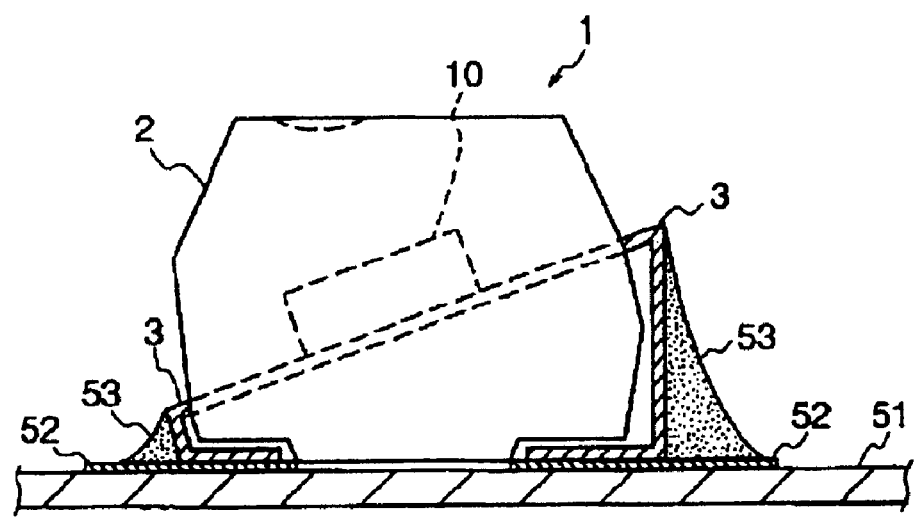
FIG. 2B shows a mounting example of a gyro sensor device.

For example, as shown in FIG. 2B, if the bending part 4d is not formed between the bending parts 4c and 4e of the lead terminal 3, the amount of the solder 53 coated on it is larger than that of the lead terminal 3 having a short lead part from the bending parts 4a to 4b. This imbalance causes a large difference in surface tension of the solder 53 at both sides, and the lead terminal having the short lead part may float from the mount surface 51. That is, errors may occur in a tilt angle since the gyro sensor device 1 is fixed slanted.

Therefore, in the gyro sensor device 1, the bending parts 4c, 4d, and 4e are formed in the lead terminal 3 having a long lead part from the bending parts 4c to 4e to limit the solder amount coated along it. This structure can limit the solder amount coated along the lead terminal having the long lead part. As a result, the occurrence of errors in the tilt angle of the gyro sensor device 1 fixed to the mount board 51.

Particularly, setting the height position of the lead terminal having the long lead part equal to that of the lead terminal having the short lead part is more preferable since the solder amount coated along each lead terminal 3 makes equal.

In addition, even if the solder coats the lead terminal 3 having the long lead part beyond the bending part 4d upward, the surface of the lead terminal 3 coated by the solder does not face any pattern electrode 52. Thus, surface tension causing the gyro sensor device 1 to be tilted does not occur in this case.

Here, the gyro sensor device 1 has the upper surface and the mounting side surface that are in parallel with each other. This structure allows the gyro sensor device 1 to be moved in the vertical direction to the mount board 51 and to be mounted on it after suctioning the upper surface of the gyro sensor device 1 by using a parts-mounting device.

In this case, the gyro sensor device 1 is pushed to the mount board 51 while a force is equally applied to the lead terminals 3 or uniformly applied to the bottom surface of the resin part 2 upon mounting it to the mount board 51. As a result, the parallelism between the mount surface of the mount board 51 and the upper surface of the gyro sensor device 1 is kept high. That is, the gyro sensor device 1 is mounted to the mount board 51 without errors in the angle θ that the detection axis G makes with respect to the perpendicular line of the mount surface of the mount board 51.

In the embodiment, the gyro sensor 10 is tilted around its longitudinal direction so as to provide an angle that the Z-axis makes with respect to the vertical direction to be θ. This structure can reduce the height of the device when the gyro sensor 10 is built into the gyro sensor device 1.

Next, a method for bonding the lead terminals and the gyro sensor in the gyro sensor device of the embodiment will be described.

FIG. 3A shows the structure of a lead terminal unit used in the gyro sensor device 1 of the embodiment. FIG. 3B is a top view illustrating a state in which the gyro sensor 10 is bonded to the lead terminal unit. FIG. 3C is a backside view illustrating the state in which the gyro sensor 10 is bonded to the lead terminal unit. FIG. 3D illustrates a setback when the gyro sensor 10 is bonded to the lead terminals 3.

As shown in FIG. 3A, the lead terminal unit 61, used in the gyro sensor device 1 of the embodiment, includes the plurality of lead terminals 3 and a die pad 5. In the embodiment, the lead terminals 3 and the frame 63 are connected with suspending leads 62 to prevent the lead terminals 3 from being bent when the gyro sensor 10 and the lead terminals 3 are connected.

The die pad 5 provided on the upper surface of the lead terminal unit 61 and the gyro sensor 10 are mechanically connected with an adhesive interposed therebetween, for example. They may be electrically connected by using a conductive adhesive as the adhesive. In addition, each lead terminal 3 of the lead terminal unit 61 is electrically connected to respective electrodes 8 provided on the bottom surface of the gyro sensor 10 with a bonding wire or a conductive adhesive or the like.

Here, if the suspending leads 62 for the lead terminals 3 are not provided, the gyro sensor 10 sometimes rotates around the die pad as an axis due to the bending of the lead terminals 3 as shown in FIG. 3D when the gyro sensor 10 is mounted to the lead terminal unit 61. As a result, the gyro sensor 10 cannot be mounted to the lead terminals 3 with high accuracy, possibly errors occurring in the tilt angle of the gyro sensor 10. In contrast, the gyro sensor device 1 of the embodiment can suppress the rotation of the gyro sensor 10 since the bending of the lead terminals 3 are suppressed by fixing the lead terminals 3 with the suspending leads 62.

As a result, the accuracy of the tilt angle of the gyro sensor device 1 of the embodiment can be enhanced. As shown in FIG. 3A, the lead terminal unit 61 includes three suspending terminals 62 fixing the distal parts of the lead terminals 3. The suspending lead 62 for fixing the distal part of the lead terminal 3 may be diagonally provided at least two positions with respect to the die pad 5. This arrangement can suppress the rotation of the gyro sensor 10 in the diagonal direction. Here, the suspending leads 62 are cut off after the resin part 2 is formed.

Next, a method of manufacturing the gyro sensor device of the first embodiment will be described.

Figure 4:
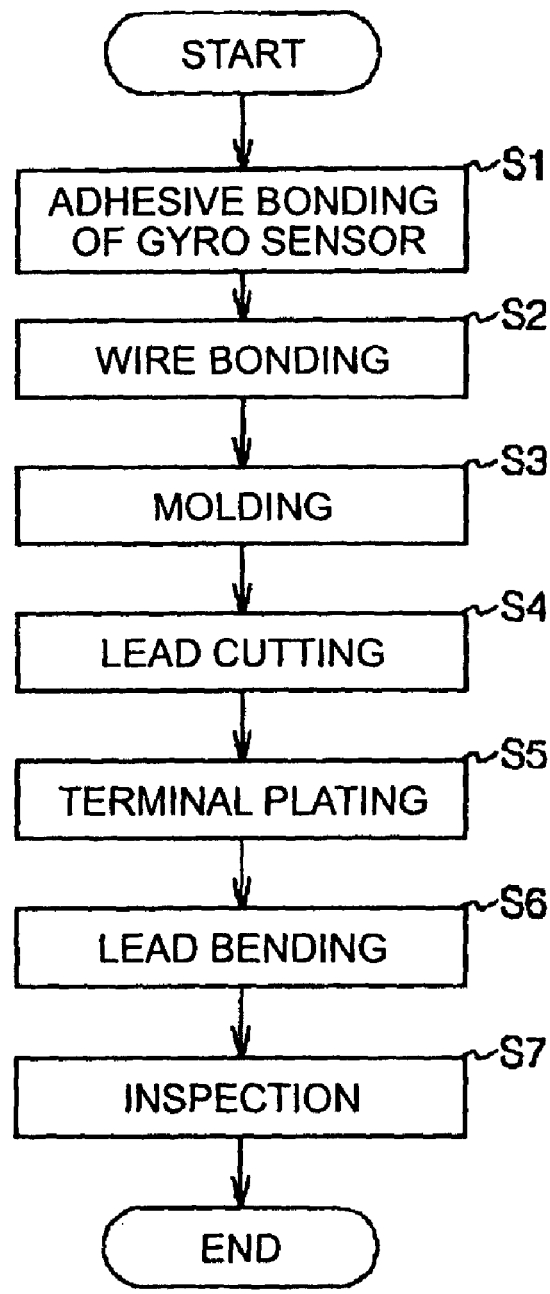
FIG. 4 is a flowchart illustrating manufacturing steps of the gyro sensor device.

FIG. 4 is a flowchart illustrating manufacturing steps of the gyro sensor device.

First, in step S1, an adhesive (nonconductive adhesive or epoxy based adhesive) is applied to the die pad 5 or the gyro sensor 10, and then the gyro sensor 10 is placed on the die pad 5 to adhere.

Next, in step S2, a wire bonding is performed by forming wires between the lead terminals 3 and the electrode terminals 8 provided on the bottom surface of the gyro sensor 10 by a wire bonding method.

Next, in step S3, molding is performed in which the gyro sensor 10 is molded with a resin. The molding is performed by a so-called transfer molding method, in which the lead terminals 3 are set and sandwiched between an upper and lower dies each of which have a cavity so that the gyro sensor 10 is housed in the cavity, and then the cavity is filled with the resin. In this case, the lead terminals 3 exposed from the die are extended to have an original shape. In addition, a number of patterns of the lead terminals 3 are formed so as to mount a plurality of gyro sensors 10.

In this step, the upper and lower dies are heated and kept at a predetermined temperature in accordance with the characteristics of the resin, and then the lead terminals 3, on which the gyro sensor 10 is bonded with wires, are positioned and placed on the lower die by using the positioning pins of the lower die as a positioning reference, for example. Next, a resin tablet is put into a plunger pot of the lower die. Then, the upper die is placed on the lower die so as to sandwich the lead terminals 3 therebetween. Subsequently, the upper and lower dies are uniformly clamped by applying a predetermined pressure. As a result, the gyro sensor 10 is housed inside each cavity of the upper and lower dies.

Next, the resin tablet inside the plunger pot is pre-heated at a predetermined temperature to be melted. The melted resin is injected into the cavity from the gates of the upper and lower dies by operating the plunger with a predetermined phase, velocity, and temperature. After the cavity is filled with the melted resin, a fixed time is kept to form the resin. After the resin is formed, the upper die is removed from the lower die by releasing the clamping of the dies. Then, a remaining cull produced by the resin overflowing around the cavity is removed. Next, the lead terminals 3 with molded resin are taken out from the lower die, and then dried in an oven at a predetermined temperature for a given period.

Next, in step S4, the ends of the lead terminals 3 and the suspending leads between the leads are cut off by stamping or the like so as to make the molded part as an individual piece. Subsequently, in step S5, a terminal plating is performed in which the lead terminals exposed from the molded part are plated with bonding metal such as tin (Sn) and solder. Then, the bending parts 4a and 4c are bent into a predetermined shape by fixing the lead terminals between the bending part 4a and the resin part 2 as well as the bending part 4c and the resin part 2. Next, in step S6, the bending parts 4b and 4d are bent by fixing the lead terminals between the bending part 4b and the resin part 2 as well as the bending part 4d and the resin part 2, achieving the gyro sensor device 1.

The terminal plating may be carried out before or after the lead terminals and suspending leads are cut off.

Finally, in step S7, necessary inspection such as characteristics inspection and outer appearance inspection is carried out, ending the manufacturing steps of the gyro sensor device 1 of the embodiment.

As described above, the method for manufacturing the gyro sensor device 1 of the embodiment, in which the detection axis of the gyro sensor 10 and the upper surface of the resin part 2 are set at a desired angle, with high productivity can be provided.

Next, a die used for molding in the above method for manufacturing the gyro sensor device 1 will be described with reference to the drawings.

Figure 13:
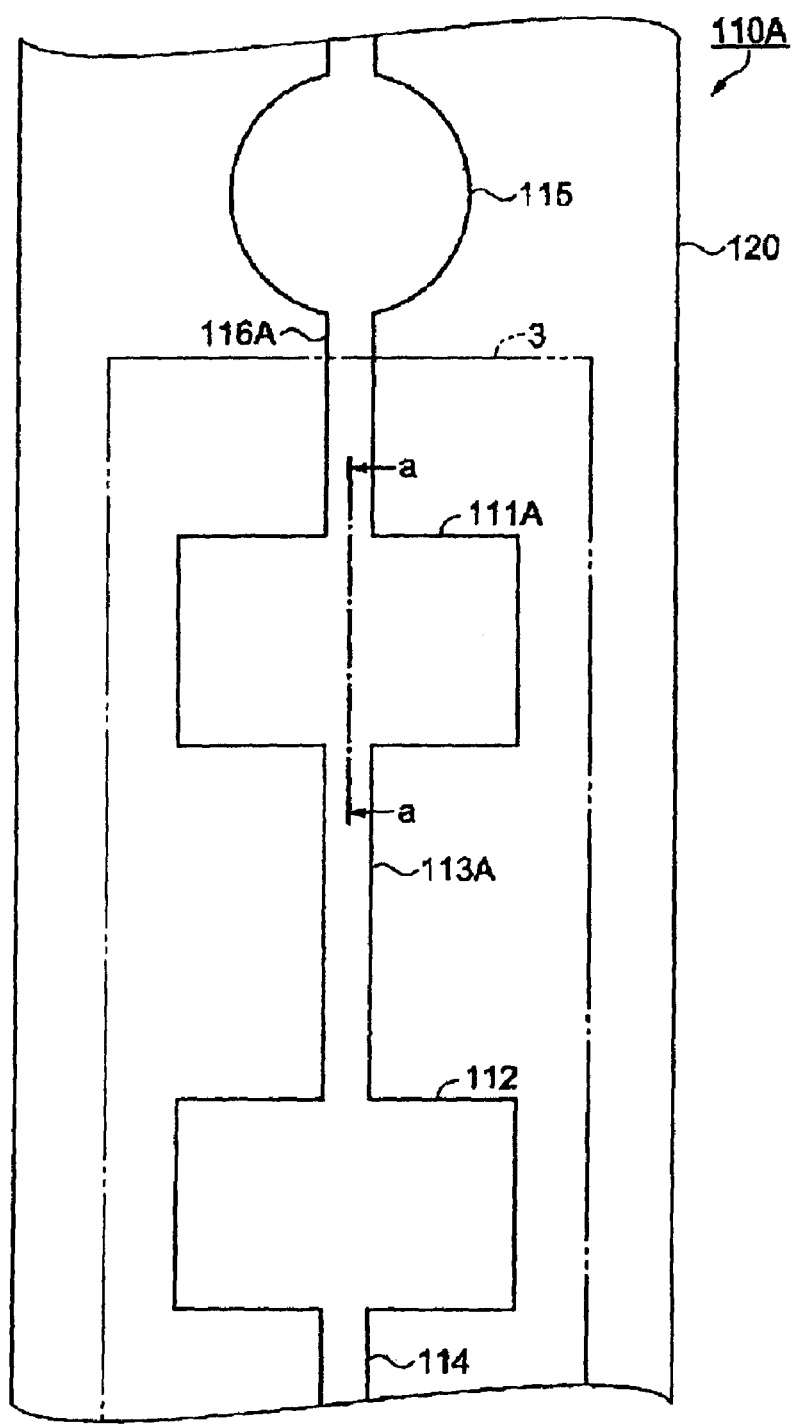
FIG. 13 is a schematic view illustrating the structure of a lower die of a molding die.
Figure 14:
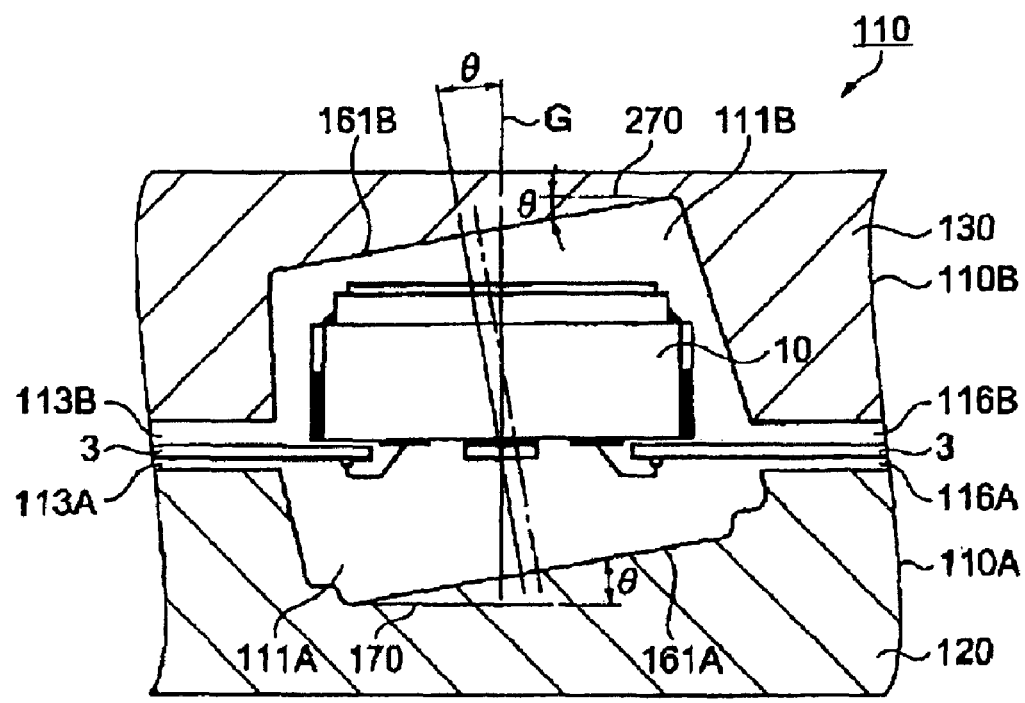
FIG. 14 is a schematic view illustrating the whole structure of the molding die.
Figure 15A:
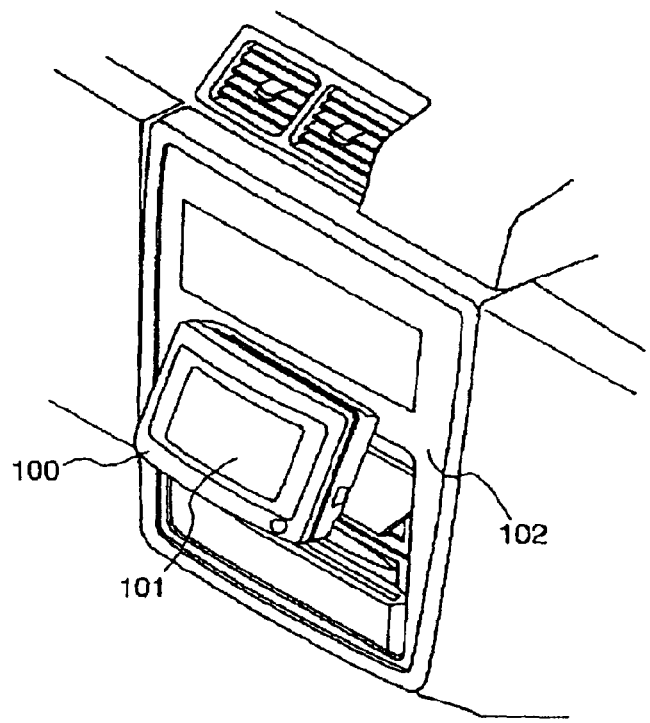
FIGS. 15A and 15B show a navigation body installed in a center console.
Figure 15B:
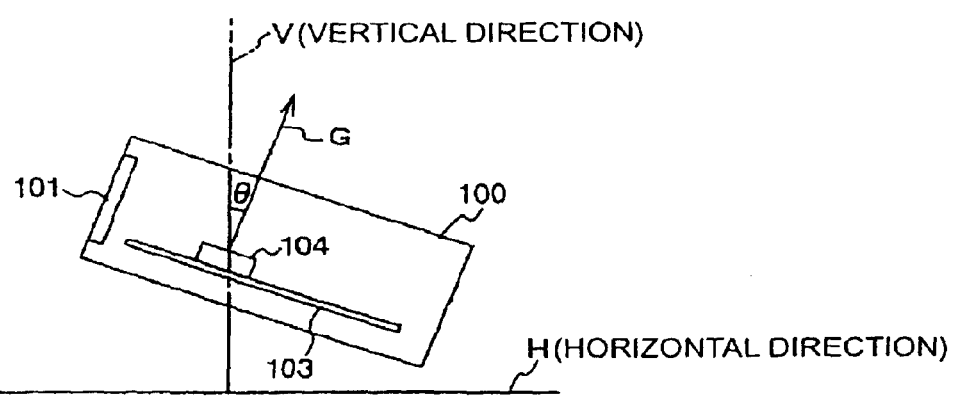

FIG. 13 is a plan view illustrating a lower die 110A, which constitutes a molding die with an upper die. FIG. 14 is a sectional view illustrating a whole structure of a molding die 110, the sectional view being taken along the line a-a in FIG. 13 where an upper die 110B is set to the lower die 110A with the lead terminals 3 interposed therebetween.

The molding die 110 includes the upper die 110B and the lower die 110A. In order to easily explain the structure of a resin injection path or the like in the molding die 110, the structure of the lower die 110A will be described with reference to FIG. 13.

The lower die 110A includes a lower die body 120, made of metal or the like, in which a plurality of concave parts (cavities) are formed and each cavity is connected in series by communicating with a linking path (e.g. gate), also a concave part.

The lower die 110A is provided with a plunger pot 115, in which a plunger (not shown) is set, inside a concave part formed in the lower die body 120 in a cylindrical shape. The plunger pot 115 has an opening at a part of its sidewall. From the opening, a runner 116A having a groove shape extends and connects to a cavity 111A as a first cavity, a concave part having a rectangular parallelepiped shape. Near a side, opposite to the part connecting the plunger pot 115, of the cavity 111A, a cavity 112 as a second cavity is disposed. The cavities 111A and 112 are connected by communicating with a gate 113A having a grove shape. In addition, from a side, opposite to the part connecting the cavity 111A, of the cavity 112, a gate 114 extends. The gate 114 is communicated and connected with the next cavity in the same manner, but this is not shown in FIG. 13. As described above, the plunger pot 115, the cavity 111A, and the cavity 112 are connected in series by communicating with the runner 116A, the gate 113A, and the gate 114, respectively. Likewise, the cavity 112 afterward, the necessary number of cavities are connected in series by communicating with the necessary number of gates.

Here, a rectangular area shown by the two-dot chain line in the FIG. 13 illustrates a lead frame placing position 3a upon resin molding.

In contrast, the upper die 110B is provided with a plunger pot, a plurality of cavities, and a plurality of runners and gates both of which communicate with the plunger pot and the cavities on the surface meeting the lower die 110A. They are formed in the same shape openings at the same positions corresponding to those in the lower die 110A. Upon overlapping and fixing the upper die 110B and the lower die 110A, the plunger pot 115, a space of a container shape, cavities, runners, and gates are formed. The runners and gates connect and communicate with the plunger pot 115 and cavities in series for serving as a communication path of resin.

Next, with reference to the FIG. 14, the molding die 110 including the upper die 110B and the lower die 110A will be described in a condition where the lead terminals 3, on which the gyro sensor 10 serving as a sensor device is mounted, are molded. Particularly, the cross sectional shape of the cavity of the molding die 110 will be mainly described in details.

As shown in FIG. 14, a concave bottom part 161A of the cavity 111A, the concave part formed in the lower die body 120 of the lower die 110A, is formed so as to be tilted by the angle θ with respect to a parallel line 170, parallel with the lead terminal 3 when the lead terminals 3 are placed on the lower die 110A. The bottom surface of the gyro sensor device 1 is formed corresponding to the concave bottom part 161A. Therefore, the gyro sensor device 1 is formed in which the relation between the normal line of the gyro sensor device 1 achieved by molding with the lower die 110A and the detection axis G of the gyro sensor 10 is set as a desired angle θ.

Likewise, a concave bottom part 161B of the cavity 111B, the concave part formed in an upper die body 130 of the upper die 110B shown in FIG. 14, is formed so as to be tilted by the angle θ with respect to a parallel line 270, parallel with the lead terminal 3 when the upper die 110B is overlapped and fixed on the lower die 110A on which the lead terminal 3 is placed. The upper surface of the gyro sensor device 1 is formed corresponding to the concave bottom part 161B. Therefore, the gyro sensor device 1 is formed in which the relation between the normal line of the upper surface of the gyro sensor device 1 achieved by molding with the upper die 110B and the detection axis G of the gyro sensor 10 is set as the desired angle θ.

Upon fixing (clamping) the lower die 110A and the upper die 110B with the lead terminal 3 on which the gyro sensor 10 is mounted interposed therebetween, a cavity for molding the sensor device 10 is formed by the cavity 111A of the lower die 110A and the cavity 111B of the upper die 110B.

In addition, a runner is formed by the runner 116A of the lower die 110A and the runner 116B of the upper die 110B. The runner serves as an injection path of melted resin when the resin is injected into the cavity from the plunger pot (not shown).

Further, a gate is formed by the gate 113A of the lower die 110A and the gate 113B of the upper die 110B. The gate serves as an injection path of the resin from the cavity to the next cavity.

In the embodiment, the runner 116B and the gate 113B of the upper die 110B are formed larger than the runner 116A and the gate 113A of the lower die 110A in the thickness direction, respectively. As a result, resin flows in the upper die 110B stronger than in the lower die 110A. This structure prevents a bonding part such as bonding wires and gold balls of the gyro sensor 10 from being strongly hit by the melted resin when the resin is injected. The structure is not limited to this. The runners and gates may be disposed only in the upper die 110B for skirting the bonding part of the gyro sensor 10.

Here, the sidewall of the cavities 111A and 111B are formed inward so as to be perpendicular or make an acute angle with respect to the surface contacting the lead terminals 3.

As described above, in the method for manufacturing the gyro sensor device 1 of the embodiment, the cavity 111A having the concave bottom part 161A is formed in the lower die body 120 of the lower die 110A. The concave bottom part 161A is formed so as to be tilted by the angle θ with respect to the parallel line 170, parallel with the lead terminal 3 when the lead terminal 3 is placed on the lower die 110A. In addition, the cavity 111B is formed in the upper die body 130 of the upper die 110B. The cavity 111B is the concave part formed so as to be tilted by the angle θ with respect to the parallel line 270, parallel with the lead terminal 3 when the upper die 110B is overlapped and fixed on the lower die 110A on which the lead terminal 3 is placed. Then, the lower die 110A and the upper die 110B are fixed by sandwiching the lead terminals 3 therebetween so that the gyro sensor 10 is housed in the cavity 111A and the cavity 110B. Subsequently, melted molding resin is injected into the cavities 111A and 111B to form the gyro sensor device 1.

The method can manufacture the molded package (resin part 2) having the bottom surface formed corresponding to the concave bottom part 161A of the lower die 110A, and the upper surface formed corresponding to the concave bottom part 161B of the upper die 110B. As a result, a gyro sensor device can be provided in which the detection axis G of a sensor makes a desired angle with respect to the bottom surface of the gyro sensor device. The gyro sensor device includes the sensor responding to a movement with respect to the given detection axis G, the gyro sensor 10 housing the sensor, the lead part to make electrically conduction between the terminal of the gyro sensor 10 and a mount board, and a molded package to fix the gyro sensor 10.

In addition, the bottom surface and the upper surface of the gyro sensor device can be formed in parallel with each other. The bottom surface and the upper surface of the gyro sensor device make a desired angle with respect to the detection axis G of the gyro sensor. Thus, the gyro sensor device can be picked up in the same manner of typical chip-type electronic parts by a chip mounter, for example, when the gyro sensor is mounted to a mount board or the like. Further, typical part trays and hoop shaped packaging materials (taping materials) can be used for packaging the gyro sensor device without preparing trays and hoop shaped packaging materials having a special shape. As a result, a gyro sensor device can be manufactured that can be mounted with high productivity.

In the embodiment, the runner 116B and the gate 113B of the upper die 110B are formed larger than the runner 116A and the gate 113A of the lower die 110A in the thickness direction, respectively.

Because of the structure, melted resin flows in the upper die 110B stronger than in the lower die 110A when the resin is injected into each cavity. Thus, stress applied to the bonding part such as bonding wires and gold balls of the gyro sensor 10 placed in the lower die 110A by the resin can be reduced. As a result, the occurrence of bonding wire breakage and open defects in bonding parts can be suppressed.

In addition, in the embodiment, the sidewalls of the cavity 111A of the lower die 110A and the cavity 111B of the upper die 110B are formed inward so as to be perpendicular or make an acute angle with respect to the surface contacting the lead terminals 3. This structure enhances removability in releasing the lower die 110A and the upper die 110B from the clamping state, enabling the workability to be improved.

Figure 5:
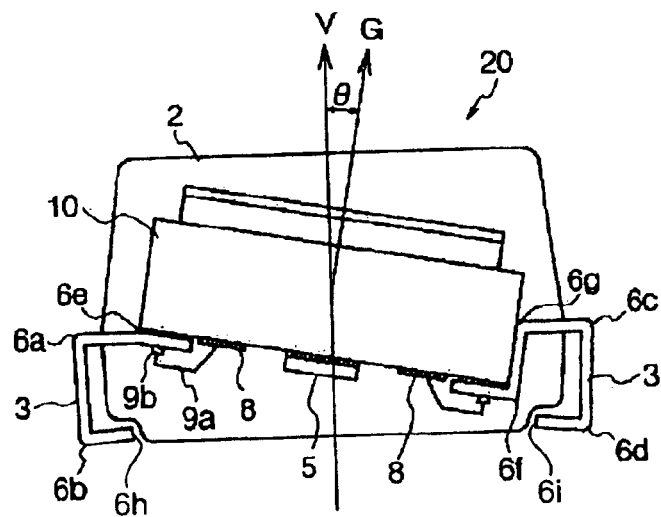
FIG. 5 is a schematic view illustrating the structure of a gyro sensor device according to a second embodiment of the invention.

FIG. 5 is a schematic view illustrating the structure of a gyro sensor device according to a second embodiment of the invention.

In a gyro sensor device 20 shown in FIG. 5, the gyro sensor 10 is sealed with the resin part 2 so that the detection axis G of the gyro sensor 10 is tilted by the angle θ with respect to the perpendicular line of a mount surface on which the gyro sensor device 20 is mounted.

In this case, also, the lead terminal 3 extends outside from both the long sides of the resin part 2 in a plurality of numbers. The gyro sensor 10 is tilted by the angle θ with respect to the upper surface of the gyro sensor device 1 by supporting with the lead terminal 3, bent at the bending parts 6e, 6f, and 6g in the resin part 2. In the structure, the length between the bending parts 6a and 6b is nearly equal to the length between the bending parts 6c and 6d. This structure can prevent the occurrence of errors in the tilt angle of the gyro sensor device 20 when it is mounted to the mount board 51.

Next, a method of manufacturing the gyro sensor device of the second embodiment will be briefly described.

In this case, first, the lead terminal 3 is stamped so that the bending parts 6e and 6g are formed as projected from and the bonding part 6f are formed as depressed from one surface thereof. On the surface, the gyro sensor 10 is mounted. Next, an adhesive (nonconductive adhesive or epoxy based adhesive) 53 is applied to the die pad 5 or the gyro sensor 10, and then the gyro sensor 10 is placed on the die pad 5 to adhere.

Figure 6:
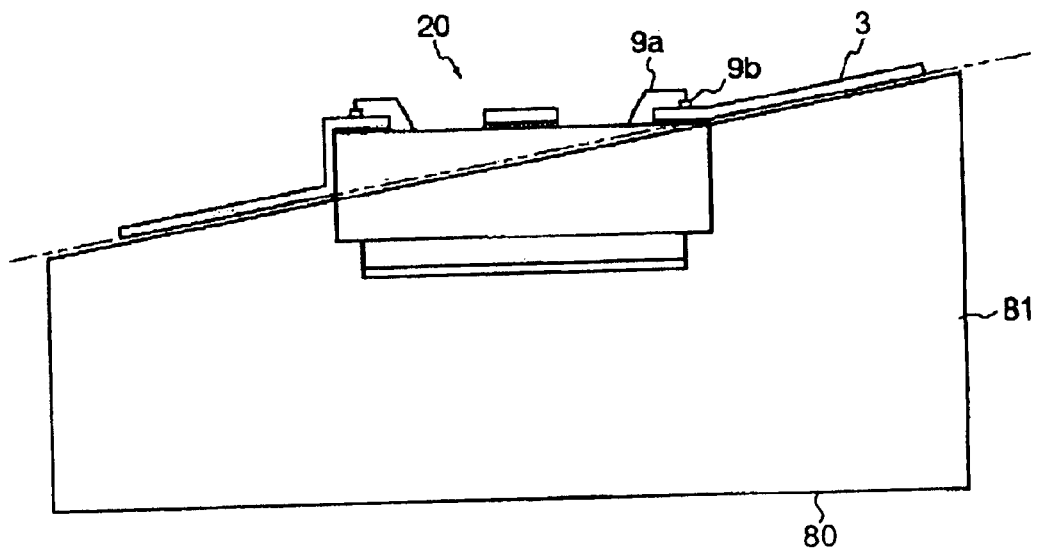
FIG. 6 is a schematic view illustrating a tool for wire bonding according to the second embodiment.

Then, the following is carried out by wire bonding: a gold ball 9b is provided on the lead terminal 3, and then a wire 9a is formed from the gold ball 9b, as a starting point, to the electrode terminal 8, as an ending point, on the bottom surface of the gyro sensor 10, for example. In this regard, the gold ball may be provided on the electrode terminal 8, and the starting and ending points are exchanged. In wire bonding, a tool 81 shown in FIG. 6 is used. The tool 81 has a shape into which the upper surface of each of a plurality of gyro sensors 10 can be set corresponding to the lead terminal 3. Here, a bottom surface 80 of the tool 81 makes the angle θ with respect to the lead terminal 3. Therefore, the bottom surface of the gyro sensor 10 and the bottom surface 80 of the tool 8 are nearly in parallel with each other when the gyro sensor 10 is set in the tool 81. In wire bonding, placing the tool 81 so that the bottom surface 80 is faced downward and nearly horizontally results in the bottom surface of the gyro sensor 10 being nearly horizontally. As a result, the wire bonding is accurately conducted.

Next, the gyro sensor 10 is molded with resin. In this case, the lead terminals 3 exposed from the molded package are extended to have an original shape. Then, the ends 6h and 6i of the lead terminals 3, and between the lead terminals 3 are cut off. Next, the lead bending parts 6b and 6d are bent by fixing the lead terminal 3 between the lead bending part 6b and the resin part 2 as well as the lead bonding part 6d and the resin part 2. Next, the lead bending parts 6a and 6c are bent by fixing the lead terminal 3 between the lead bending part 6a and the resin part 2 as well as the lead bonding part 6c and the resin part 2.

As described above, a method for manufacturing the gyro sensor device 20, in which the detection axis G of the gyro sensor and the upper surface of the resin part 2 are set at a desired angle (the angle θ that the detection axis G makes with respect to the vertical direction of a mount surface on which the gyro sensor device 20 is mounted), with high productivity can be provided. Here, the upper surface of the gyro sensor device 20 and the surface on which the gyro sensor device 20 is mounted are in parallel with each other.

Figure 7:
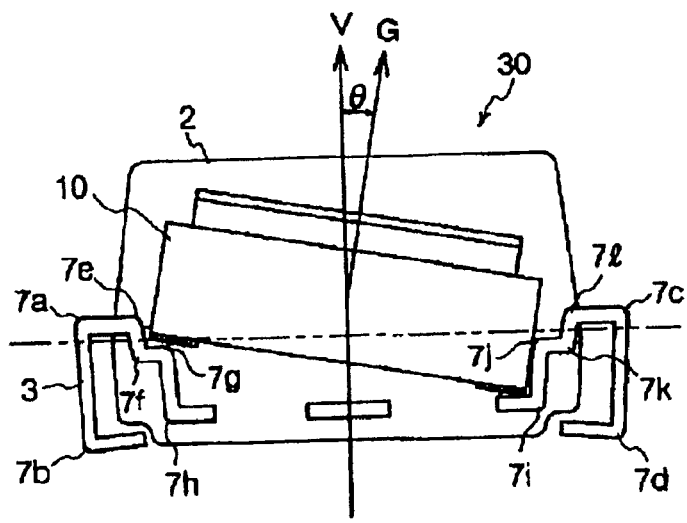
FIG. 7 is a schematic view illustrating the structure of a gyro sensor device according to a third embodiment of the invention.

FIG. 7 is a schematic view illustrating the structure of a gyro sensor device according to a third embodiment of the invention.

In a gyro sensor device 30 shown in FIG. 7, the gyro sensor 10 is sealed with the resin part 2 so that the gyro sensor 10 is tilted by the angle θ with respect to the vertical direction of a mount surface on which the gyro sensor device 30 is mounted.

In this case, also, the lead terminal 3 extends outside from both the long sides of the resin part 2 in a plurality of numbers. The gyro sensor 10 is tilted by the angle θ with respect to the upper surface of the gyro sensor device 30 by supporting with the lead terminal 3, bent in a step shape at the bending parts 7e, 7f, 7g, 7h, 7i, 7j, 7k and 7l in the resin part 2. In the structure, the length between the bending parts 7a and 7b is nearly equal to the length between the bending parts 7c and 7d. This structure can prevent the occurrence of errors in the tilt angle of the gyro sensor device 30 when it is mounted to the mount board 51.

In addition, the gyro sensor 10 can be placed in parallel with the upper surface of the gyro sensor device 30 by placing the gyro sensor 10 parallel on the upper step of the lead terminal 3. That is, the detection axis G of the gyro sensor 10 can coincide with the vertical direction or make the desired angle θ with respect to the detection axis G by only changing the position of the step for placing the gyro sensor 10.

Next, a method of manufacturing the gyro sensor device of the third embodiment will be described.

In this case, the lead terminal 3 is stamped so that the bending parts 7e, 7g, 7j and 7l are formed as projected from and the bonding part 7f, 7h, 7i and 7k are formed as depressed from one surface thereof. On the surface, the gyro sensor 10 is mounted. Here, the lead terminal 3 is linked in a plurality of numbers (not shown) to have a shape allowing the bottom of a plurality of gyro sensors 10 to be set in it.

Solder paste is coated on the electrode terminal 8 on the bottom surface of the gyro sensor 10, or near the bending part 7g or 7i of the lead terminal 3. The solder paste is heated at a temperature of the melting point or more, and cooled down to normal temperature to mechanically and electrically connect the electrode terminal 8 to the lead terminal 3.

Next, the gyro sensor 10 is molded with resin. In this case, the lead terminals 3 exposed from the molded package are extended to have an original shape. Then, the end of the lead terminal 3 and suspending leads are cut off. Next, the bending parts 7b and 7d are bent by fixing the lead terminal 3 between the bending part 7b and the resin part 2 as well as the bonding part 7d and the resin part 2. Next, the bending parts 7a and 7c are bent by fixing the lead terminal 3 between the bending part 7a and the resin part 2 as well as the bonding part 7c and the resin part 2. As described above, a method for manufacturing the gyro sensor device 30 with high productivity can be provided.

Next, the gyro sensor 10 mounted in the gyro sensor device of the above embodiments will be described.

Figure 8:
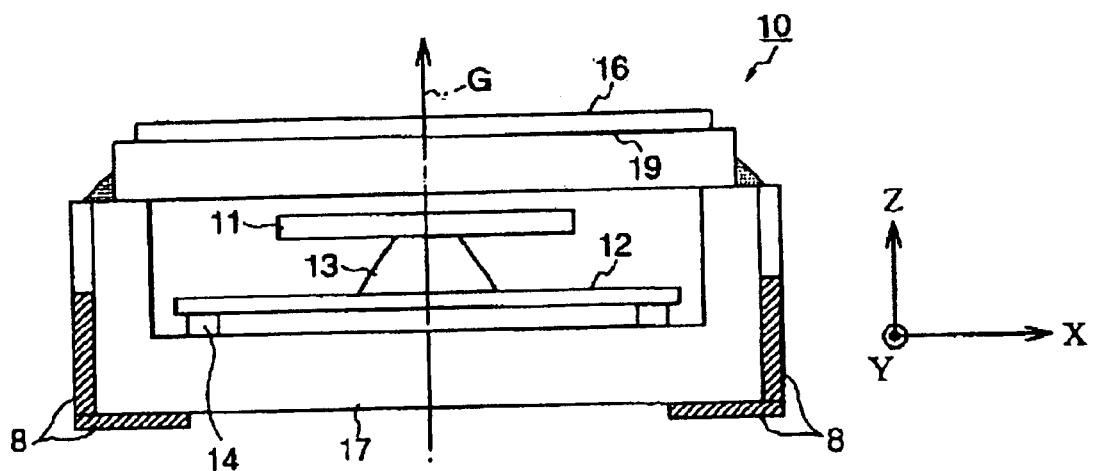
FIG. 8 is a sectional view illustrating an internal structure of a gyro sensor 10.
Figure 9A:
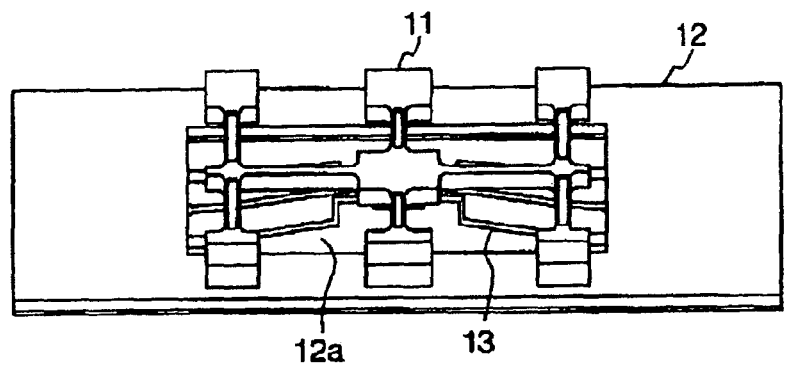
FIGS. 9A to 9C are schematic views illustrating the structure of a support substrate included in the gyro sensor 10.
Figure 9B:
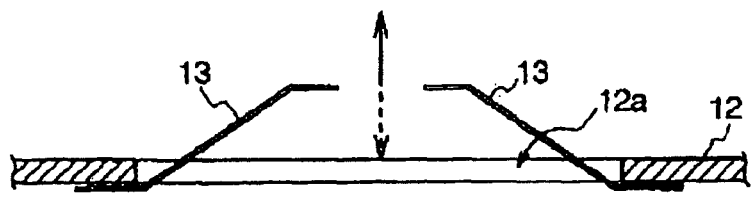
Figure 9C:
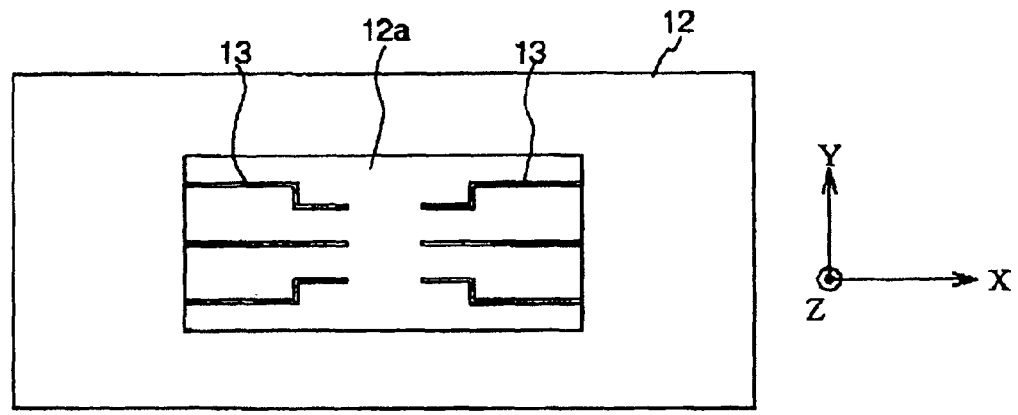

FIG. 8 is a cross sectional view illustrating the internal structure of the gyro sensor 10. FIGS. 9A to 9C are schematic views illustrating the structure of a support substrate provided in the gyro sensor 10.

As shown in FIG. 8, the gyro sensor 10 includes a quartz crystal resonator element 11 as a detection element to detect angular velocity. As shown in FIGS. 9A and 9B, the quartz crystal resonator element 11 is mechanically and electrically connected to a support substrate 12 with wires 13, supporting member having flexibility. The support substrate 12 is connected to the bottom surface inside a ceramics package 17 with an adhesive 14. In addition, at the center of the support substrate 12, an opening 12a is formed. Through the opening 12a, the wires 13 are provided from the back surface to the upper surface side of the support substrate 12. On the upper surface of the ceramics package 17, a lid 16 made of metal is bonded with a sealing member 19 such as low melting point metal. This structure allows the inside of the ceramics package 17 to be vacuum sealed. A glass lid also can be used as the lid 16. In this case, low melting point glass is used as the sealing member 19, for example. The electrode terminal 8 is formed from the external bottom surface to the sidewall of the ceramics package 17. The electrode terminal 8 is connected to the quartz crystal resonator element 11 through an internal conductive member (not shown) formed in the ceramics package 17.

Here, at least two, provided parallel at the center, out of six wires 13 shown in FIG. 8 serve as a support member mainly supporting the quartz crystal resonator element 11.

Figure 10B:
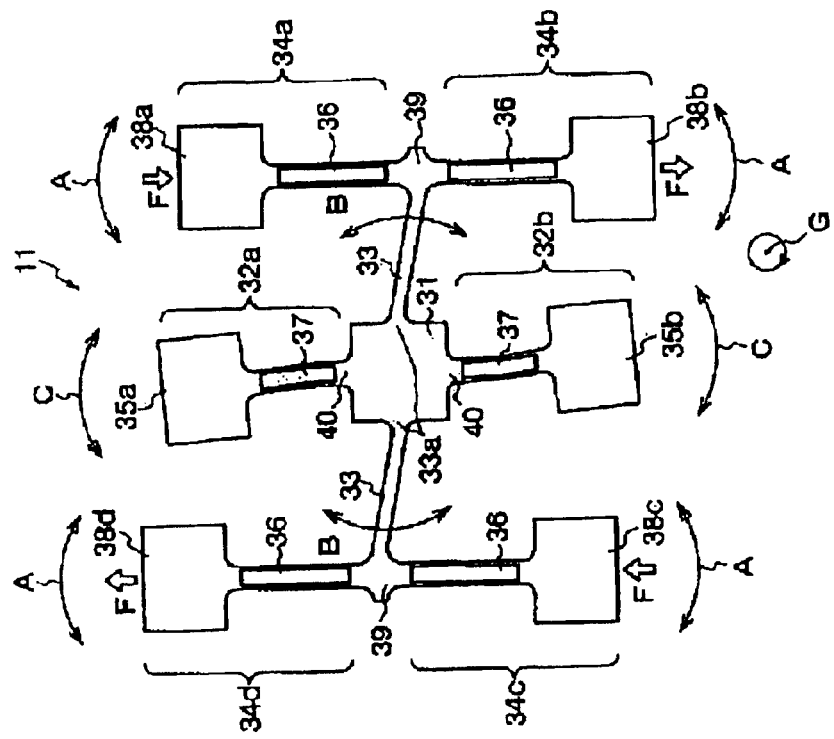
FIG. 10B is a plan view illustrating a vibration of the detection vibration mode of the quartz crystal resonator element 11.
Figure 10A:
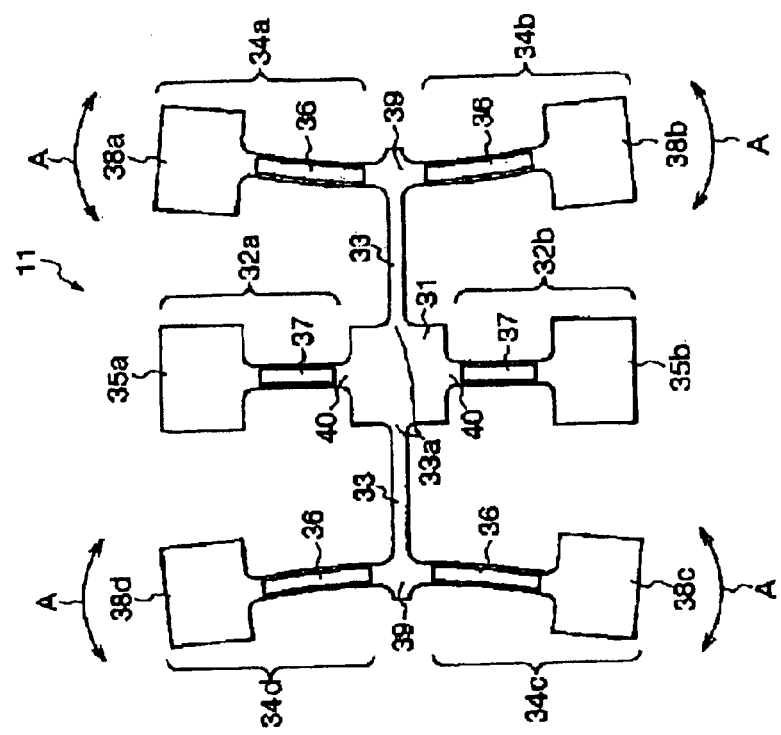
FIG. 10A is a plan view schematically illustrating a quartz crystal resonator element 11.

FIG. 10A is a plan view schematically illustrating the quartz crystal resonator element 11 of the embodiments. FIG. 10B is a plan view illustrating a vibration of the detection vibration mode of the quartz crystal resonator element 11.

The quartz crystal resonator element 11 shown in FIGS. 10A and 10B is provided with a base 31, a pair of detection vibration arms 32a and 32b protruded from the base 31, a pair of connection parts 33 protruded from the base 31, and driven vibration elements 34a, 34b, 34c, and 34d provided at ends of the connection parts 33. Each main surface of the driven vibration elements 34a, 34b, 34c, and 34d includes an elongate groove. Each transverse section of the driven vibration elements 34a, 34b, 34c, and 34d shows a nearly H-shape. In addition, an exciting electrode (or driving electrode) 36 is formed in each groove. At each end of the driven vibration elements 34a, 34b, 34c, and 34d, respective wide-width parts or weight parts 38a, 38b, 38c, and 38d are provided. Each main surface of the detection vibration elements 32a and 32b includes an elongate groove. Each transverse section of the detection vibration elements 32a and 34b shows a nearly H-shape. In each groove, a detection electrode 37 is formed. At the end of the detection vibration element 32a, a weight part 35a is provided while at the end of the detection vibration element 32b, a weight part 35b is provided.

FIG. 10A shows the vibration of a driven mode. In the driven mode, each of the driven vibration element 34a, 34b, 34c, and 34d performs a flexural vibration around a root part 39 to the connection part 33 as shown by an arrow A. In the state, the quartz crystal resonator element 11 is rotated around a rotation axis G, nearly perpendicular to the quartz crystal resonator element 11, at an angular velocity ω. As shown in FIG. 10B, a resulting Coriolis force F is applied to the weight parts 38a, 38b, 38c, and 38d in a direction perpendicular to both the direction A of the flexure vibration and the rotation axis G. As a result, the connection part 33 performs a flexural vibration around a root part 33a to the base 31 as show by an arrow B. As a counteraction to the vibration, each of the detection vibration elements 32a and 32b performs a flexural vibration around a root part 40 to the base 31 as show by an arrow C. The flexural vibration shown by the arrow C generates a piezoelectric phenomenon, changing the potential of the detection electrode 37. The potential change is detected by a detection circuit (not shown) to obtain the angular velocity ω around the detection axis (rotation axis) G. The detection efficiency can be increased if the crystal axis direction of the Z-axis of the quartz crystal resonator element 11 is aligned to the rotation axis G as a result of setting the crystal axis direction of +X/−X axis of the quartz crystal resonator element 11 as the arrow A direction.

The detection element that employs the quartz crystal resonator element 11 and is structured as described above can achieve the gyro sensor having a height lower than that employing a tuning fork quartz crystal resonator, the rotation axis coinciding with the extending direction of the detection vibration element, i.e. the tuning fork quartz crystal resonator, since the direction of the rotation axis G coincides with the thickness direction of the quartz crystal resonator element 11.

Here, as shown in FIG. 8, three axes are defined as follows: the extending direction of the wire 13, the support member included in the gyro sensor 10, is the X-axis; an axis perpendicular to the X-axis in the plane in which the quartz crystal resonator element 11 is placed is the Y-axis; and an axis perpendicular to both the X-axis and Y-axis is the Z-axis. Assuming that the tilt direction of the gyro sensor 10 is set to coincide with the X-axis direction as shown in FIGS. 11A and 11B. In this case, a frequency difference occurs between the resonance frequencies of wires 13a and 13b shown in FIGS. 11A and 11B, possibly resulting in the operational conditions of the gyro sensor 10 being unstable.

That is, when the detection axis G is tilted so as to have the angle θ by setting a side adjacent to the wire 13a higher than a side adjacent to the wire 13b as shown in FIG. 11B, with respect to the direction of the X-axis component of the gravity acceleration, the extending direction of the wire 13a is opposite to the extending direction of the wire 13b. Therefore, the wires 13a and 13b are differently influenced by the acceleration (difference in the direction of inertial force). For example, the following are defined as shown in FIG. 11C: the resonance frequency of the quartz crystal resonator element 11 is fref, and the resonance frequency of each of the wires 13a and 13b is f0 when the quartz crystal resonator 11 is placed horizontally. In the tilted state, tensile force is produced in the wire 13a, while compressive force is produced in the wire 13b by the influence of the X-axis component of the gravity acceleration, resulting in the resonance frequency fa of the wire 13a being higher and the resonance frequency fb of the wire 13b being lower. As a result, the resonance frequencies of the wires 13a and 13b may greatly differ in each other. If the resonance frequencies of the wires 13a and 13b greatly differ in each other, the coupling of resonance energy is likely to occur due to a close approach to the resonance frequency of the quartz crystal resonator element 11, and the mounted condition of the quartz crystal resonator element 11 is likely to be unstable.

Figure 12A:
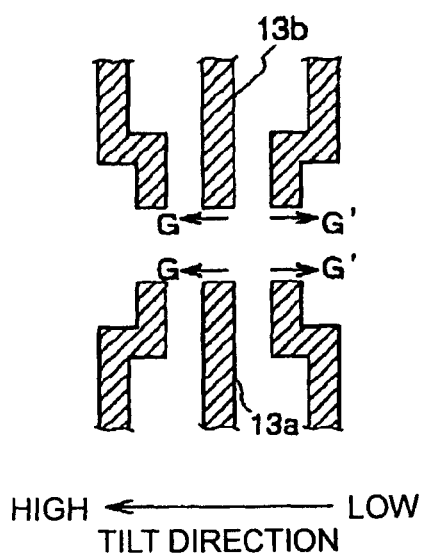
FIG. 12A is a plan view illustrating the wires 13 and a tilt direction where the present invention is applied.
Figure 12B:
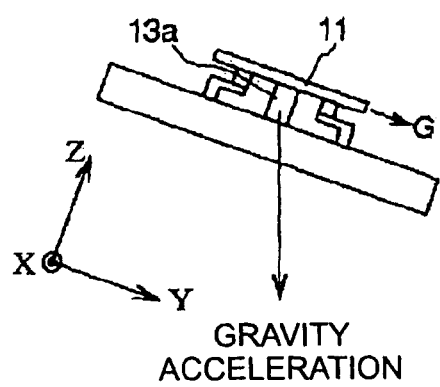
FIG. 12B is a side view illustrating a gyro sensor device, in which the quartz crystal resonator element 11 is placed on the wires 13 shown in FIG. 12A, installed tilted.
Figure 12C:
FIG. 12C shows the relationship between the resonance frequency of the wire 13 of the gyro sensor device shown in FIG. 12B and the resonance frequency of the quartz crystal resonator element 11.

In the first embodiment, the gyro sensor 10 is mounted in the gyro sensor device 1 so that the tilt direction of the gyro sensor 10 (the quartz crystal resonator element 11) coincides with the Y-axis direction as shown in FIGS. 12A and 12B. That is, when the wires 13a and 13b are disposed so that their tilt directions are symmetric with respect to the center axis, the acceleration equally influences both the wires 13a and 13b when the acceleration is applied in the Y-axis direction. As a result, the frequency difference hardly occurs between the resonance frequencies of the wires 13a and 13b as shown in FIG. 12C. This structure brings, for example, an advantage of easy controlling a frequency adjustment or the like. In addition, the wire 13 is less influenced by the acceleration since the extending direction of the wires 13a and 13b does not coincide with the acceleration direction (the Y-axis direction). Therefore, the variation amount of each resonance frequency of the wires 13a and 13b can be lessened as shown in FIG. 12C, bringing an advantage in that the coupling of resonance energy hardly occurs.

Further, when the tilt directions of the wires 13a and 13b are set symmetrically with respect to the center axis as shown in FIG. 12A, and the extending directions of the wires 13a and 13b are perpendicular to the tilt direction, the changing characteristics of each resonance frequency of the wires 13a and 13b are nearly equal even though the direction of the acceleration in the Y-axis direction is opposite (shown as G) as the sensor is placed horizontally. This structure allows the gyro sensor of the embodiments to be mounted horizontally, for example.

The gyro sensor device including the gyro sensor 10 structured as described above can suppress adverse influences, given by the changing characteristic of the resonance frequencies of the wires 13a and 13b, to the gyro sensor device with respect to the acceleration in the traveling direction of a vehicle, since the gyro sensor device is installed in the vehicle so that the Y-axis direction coincides with the acceleration direction of the vehicle.

The wire 13 may be one that is made of quartz, integrated to the base 31 of the quartz crystal resonator element 11, and shaped in a reed.

The entire disclosure of Japanese Patent Application Nos: 2006-216505, filed Aug. 9, 2006 and 2006-249404, filed Sep. 9, 2006 are expressly incorporated by reference herein.

What is claimed is:

1. A method of manufacturing an inertial sensor, in which
a sensor device in which is packaged a detection element that detects an amount of a physical quantity, and
a lead frame that includes a plurality of lead terminals electrically connected to the sensor device are mold packaged in resin;
an upper mold being provided that has a first concave portion for forming a cavity, and a second concave portion for forming a coupling path at both sides of the first concave portion;
a lower mold being provided that has a third concave portion for forming the cavity, and a fourth concave portion for forming the coupling path at both sides of the third concave portion;
the method comprising:
a step of seating the sensor device in the cavity that is provided by placing together the first concave portion and the third concave portion;
a step of seating the lead frame in the coupling path that is provided by placing together the second concave portion and the fourth concave portion; and
a step of injecting the resin into the cavity from the coupling path, and molding the resin;
a concave bottom portion of at least one of the top mold or the bottom mold being inclined with respect to a line parallel to the lead frame.

2. A method of claim 1, an inertial sensor, comprising:
a detection element detecting an amount of a physical quantity in a detection axis direction;
a plurality of support members having flexibility and supporting nearly a center of the detection element, the plurality of support members each including first and second ends;
a package substrate, mounted at an angle θ with respect to the vertical axis, housing the detection element and the plurality of support members; and
a substrate including an opening portion formed therein, the first end of the plurality of support members connected at a lower surface of the substrate, the second end of the plurality of support members extending through the opening portion of the substrate above an upper surface of the substrate,
wherein in a case when an X-axis is defined as an extending direction of the detection element, a Y-axis is perpendicular to the X-axis, and a Z-axis is perpendicular to the X-axis and the Y-axis, at least two of the support members are disposed symmetrically with respect to the Y-axis through the center of the detection element,
wherein the detection element has a detection axis that detects an angular velocity and coincides with a direction of Z-axis that makes the angle of θ with respect to a vertical direction, and a resulting combined load of a load component in a direction of Y-axis and a load component in the direction of Z-axis includes a load component based on gravity acceleration, one of load components of the detection element in the direction of Y-axis applied to the support members disposed symmetrically with respect to the Y-axis through the center of the detection element is nearly equal to other load applied to the symmetrical support members at the other side of the Y-axis through the center of the detection element, and one of load components of the detection element in the direction of Z-axis applied to the support members disposed symmetrically with respect to the Y-axis through the center of the detection element is nearly equal to other load applied to the symmetrical support members at the other side of the Y-axis through the center of the detection element.

3. A method of claim 1, an inertial sensor device, comprising;
the inertial sensor according to claim 1;
a plurality of lead terminals electrically coupled to the inertial sensor;
a molded package including the inertial sensor;
wherein the molded package includes a first lead terminal extending toward a direction of a bottom surface of the molded package from a first side of the molded package, and a second lead terminal longer than the first lead terminal, the second lead terminal extending toward the direction of the bottom surface of the molded package from a second side opposite the first side, and the second lead terminal includes a plurality of bending parts adjacent the molded package.

4. The method of manufacturing an inertial sensor according to claim 1, the plurality of lead terminals being fixed by a hanging lead between adjacent ones of the lead terminals, the method further comprising a step in which the hanging lead is removed, after the molding step.

5. The method of manufacturing an inertial sensor according to claim 1, an angle formed by the bottom concave surface with respect to the line parallel to the lead frame substantially matching an angle between (i) a direction perpendicular to a sensor device mounting surface and (ii) a detection axis of the sensor device.

6. The method of manufacturing an inertial sensor according to claim 1, a concave bottom surface of the top mold being substantially parallel to a concave bottom surface of the bottom mold.

7. The method of manufacturing an inertial sensor according to claim 1, the lead frame seated in the coupling path being arranged at a position closer to the fourth concave portion than the second concave portion.

8. A method of manufacturing an inertial sensor, in which
a sensor device in which is packaged a detection element that detects an amount of a physical quantity, and
a lead frame that includes a plurality of lead terminals electrically connected to a lower surface of the sensor device are mold packaged in resin;
a concave portion being provided in an inclined surface, an angle between the inclined surface and a bottom surface of the concave portion substantially matching an angle between (i) a direction perpendicular to a sensor device mounting surface and (ii) a detection axis of the sensor device, the method comprising:
a step of aligning an upper surface of the sensor device with the bottom surface of the concave portion, and forming the plurality of lead terminals, which extend from a lower surface of the sensor device, so as to go along the inclined surface;
a step of molding the sensor device in resin; and
a step of bending the plurality of lead terminals, which extend from the resin, toward the molded package.

9. A method of claim 8, an inertial sensor, comprising:
a detection element detecting an amount of a physical quantity in a detection axis direction;
a plurality of support members having flexibility and supporting nearly a center of the detection element, the plurality of support members each including first and second ends;
a package substrate, mounted at an angle $\theta$ with respect to the vertical axis, housing the detection element and the plurality of support members; and
a substrate including an opening portion fanned therein, the first end of the plurality of support members connected at a lower surface of the substrate, the second end of the plurality of support members extending through the opening portion of the substrate above an upper surface of the substrate,
wherein in a case when an X-axis is defined as an extending direction of the detection element, a Y-axis is perpendicular to the X-axis, and a Z-axis is perpendicular to the X-axis and the Y-axis, at least two of the support members are disposed symmetrically with respect to the Y-axis through the center of the detection element,
wherein the detection element has a detection axis that detects an angular velocity and coincides with a direction of Z-axis that makes the angle of $\theta$ with respect to a vertical direction, and a resulting combined load of a load component in a direction of Y-axis and a load component in the direction of Z-axis includes a load component based on gravity acceleration,
one of load components of the detection element in the direction of Y-axis applied to the support members disposed symmetrically with respect to the Y-axis through the center of the detection element is nearly equal to other load applied to the symmetrical support members at the other side of the Y-axis through the center of the detection element, and
one of load components of the detection element in the direction of Z-axis applied to the support members disposed symmetrically with respect to the Y-axis through the center of the detection element is nearly equal to other load applied to the symmetrical support members at the other side of the Y-axis through the center of the detection element.

10. The method of manufacturing an inertial sensor according to claim 8, the plurality of lead terminals being fixed by a hanging lead between adjacent ones of the lead terminals, the method further comprising a step in which the hanging lead is removed, after the molding step.

* * * * *